US009274259B2

(12) United States Patent
Jeon et al.

(10) Patent No.: US 9,274,259 B2
(45) Date of Patent: Mar. 1, 2016

(54) DISPLAY DEVICE

(71) Applicant: LG Display Co., Ltd., Seoul (KR)

(72) Inventors: Ii Jeon, Seoul (KR); Su Jung Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 608 days.

(21) Appl. No.: 13/689,483

(22) Filed: Nov. 29, 2012

(65) Prior Publication Data

US 2013/0148199 A1 Jun. 13, 2013

(30) Foreign Application Priority Data

Dec. 12, 2011 (KR) .................. 10-2011-0133276
Sep. 19, 2012 (KR) .................. 10-2012-0104114

(51) Int. Cl.
*G02B 5/30* (2006.01)
*H01L 27/32* (2006.01)
*H01L 21/32* (2006.01)
*H01L 51/52* (2006.01)

(52) U.S. Cl.
CPC ............... *G02B 5/30* (2013.01); *G02B 5/3033* (2013.01); *G02B 5/3083* (2013.01); *H01L 21/32* (2013.01); *H01L 27/32* (2013.01); *H01L 51/5281* (2013.01)

(58) Field of Classification Search
CPC .. G02B 5/3033; G02B 5/3083; G02B 27/286; G02F 1/13363; G02F 1/133634; G02F 1/133638; H01L 27/32; H01L 2924/12044

USPC .......... 359/487.02, 489.07; 349/96, 117, 118, 349/121; 313/498
See application file for complete search history.

(56) References Cited

U.S. PATENT DOCUMENTS

| 4,422,727 | A | * | 12/1983 | Baeger et al. ................. 349/137 |
| 5,973,760 | A | * | 10/1999 | Dehmlow ..................... 349/102 |
| 6,181,062 | B1 | | 1/2001 | Hiraishi et al. |
| 2001/0048497 | A1 | * | 12/2001 | Miyachi et al. ............... 349/117 |
| 2002/0176164 | A1 | * | 11/2002 | Motomura et al. ........... 359/487 |
| 2003/0038912 | A1 | * | 2/2003 | Broer et al. ................... 349/122 |
| 2004/0201341 | A1 | * | 10/2004 | Miyachi et al. ............... 313/112 |
| 2006/0215091 | A1 | * | 9/2006 | Muramoto et al. ........... 349/117 |
| 2007/0182885 | A1 | * | 8/2007 | Egi et al. ......................... 349/96 |
| 2007/0206282 | A1 | | 9/2007 | Miyatake et al. |
| 2008/0043332 | A1 | * | 2/2008 | Chiba et al. ................... 359/499 |
| 2008/0068545 | A1 | * | 3/2008 | Doi et al. ....................... 349/118 |
| 2010/0039583 | A1 | * | 2/2010 | Usukura .......................... 349/62 |
| 2010/0284075 | A1 | * | 11/2010 | Yoshimi et al. ............... 359/493 |
| 2011/0025966 | A1 | * | 2/2011 | Sakai ............................. 349/119 |

FOREIGN PATENT DOCUMENTS

| CN | 1182524 A | 5/1998 |
| CN | 1701250 A | 11/2005 |
| CN | 1934468 A | 3/2007 |

* cited by examiner

*Primary Examiner* — Ricky D Shafer
(74) *Attorney, Agent, or Firm* — Fenwick & West LLP

(57) ABSTRACT

Embodiments relate to a display device for enhancing image quality. The disclosed display device includes: a display panel configured to display an image; a Poly-Vinyl Acetate (PVA) layer configured to linearly polarize external light; and a Quarter Wave Plate (QWP) configured to circularly polarize light where the QWP has an in-plane retardation value of below 140 nm.

2 Claims, 3 Drawing Sheets

Fig. 1
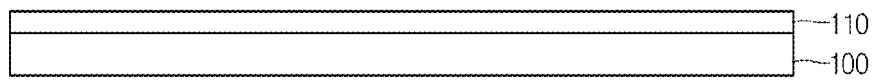
Fig.2
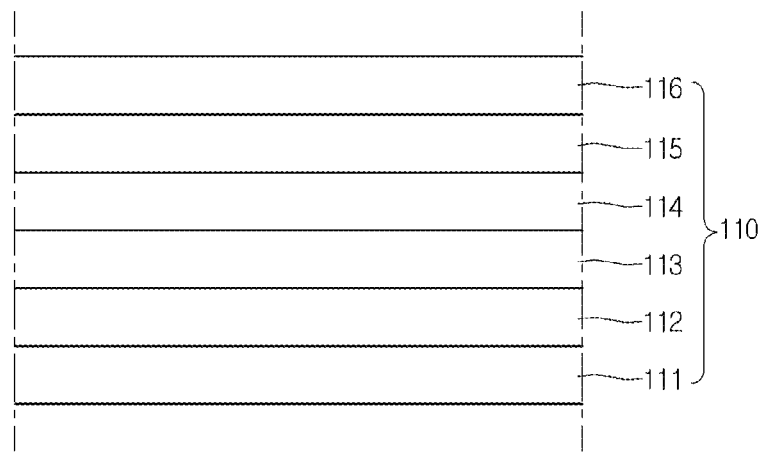
Fig.3

(a)

DISPLAY DEVICE

CROSS-REFERENCE TO RELATED APPLICATION

The present application claims priority under 35 U.S.C. §119(a) of Korean Patent Application No. 10-2011-0133276 filed on Dec. 12, 2011, and No. 10-2012-0104114 filed on Sep. 19, 2012, which are incorporated by reference herein in their entirety.

BACKGROUND

1. Field of the Disclosure

The present application relates to a display device adapted to enhance image quality.

2. Description of the Related Art

Recently, display devices have been developed to be thinner, lighter, and more portable, and to have a high performance. Flat panel display devices are receiving attention in the display field due to their reduced weight and volume compared to bulky cathode ray tubes (CRTs). The flat panel display devices include OLED (organic light-emitting display) devices which display images by controlling the amount of light emitted from an organic light emission layer.

The OLED devices are self-illuminating display devices employing a light emission layer between electrodes. As such, the OLED devices do not require a back light unit or the like contrary to liquid crystal display devices. Therefore, the OLED devices can be made thinner.

Such OLED devices display images using a plurality of pixels arranged in a matrix shape and each configured with 3 colored (i.e., red, green and blue) sub-pixels. Each sub-pixel includes an organic light emission cell and a cell driver independently driving the organic light emission cell.

The cell driver is configured with at least two thin film transistors and a storage capacitor which are connected between a gate line, a data line and a power supply line, in order to drive a pixel electrode of the organic light emission cell. The gate line is used to transfer a scan signal. The data line is used to transfer an image data signal. The power supply line is used to transfer a common voltage signal.

The organic light emission cell includes the pixel electrode connected to the cell driver, an organic layer disposed on the pixel electrode, and a cathode electrode disposed on the organic layer. As such, the OLED device includes an upper substrate and a lower substrate on which the thin film transistors and the organic light emission cells are formed.

The OLED device further includes a polarizing film. The polarizing film shields external light and enhances visibility of the OLED device. The polarizing film includes a poly-vinyl-alcohol (PVA) layer linearly polarizing light, a quarter wave plate (QWP) circularly polarizing light, and upper and lower tri-acetyl cellulose (TAC) layers disposed on upper and lower surfaces of the PVA layer.

Generally, a color shift phenomenon which forces a blue color to be visibly recognized is often observed in an OLED device. Such phenomenon is caused by retardation of the lower TAC layer and a spectral distribution property of the QWP. As a result, image quality of the OLED device is degraded.

BRIEF SUMMARY

Accordingly, embodiments of the present application are directed to a display device that substantially obviates one or more of problems due to the limitations and disadvantages of the related art.

The embodiments are to provide a display device that is adapted to enhance image quality.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, a display device includes: a display panel configured to display an image; a Poly-Vinyl Acetate (PVA) layer configured to linearly polarize external light; and a Quarter Wave Plate (QWP) configured to circularly polarize light, wherein the QWP has an in-plane retardation value below 140 nm.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 1 is a cross-sectional view showing an organic light-emitting display device according to an embodiment of the present disclosure;

FIG. 2 is a cross-sectional view showing the configuration of a polarizing sheet in FIG. 1;

FIG. 3 is a diagram comparing an ordinary Quarter Wave Plate (QWP) and a QWP of the present embodiment in reflective visibility and reflectance;

DETAILED DESCRIPTION OF THE EMBODIMENTS

Figure 4A:
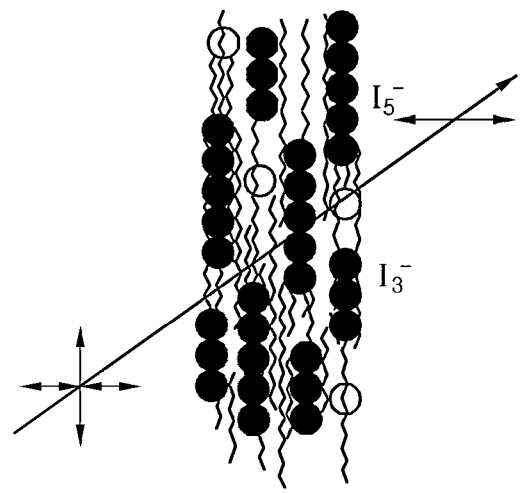
FIGS. 4A and 4B are diagrams illustrating the extinction spectrum of a Poly-Vinyl Acetate (PVA) layer according to an embodiment of the present disclosure with respect to an iodine molecular weight.

In the present disclosure, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings.

Reference will now be made in detail to the present embodiments, examples of which are illustrated in the accompanying drawings. In the drawings, the sizes and thicknesses of elements can be exaggerated, omitted or simplified for clarity and convenience of explanation, but they do not mean the practical sizes of elements.

For example, the present embodiments will now be described based on an Active Matrix OLED (AMOLED) device with a self-luminous layer, but these are not limited to this. In other words, the present embodiments can be applied to a Passive Matrix OLED (PMOLED) device, an Liquid Crystal Display (LCD) device or others. It should be understood that the present embodiments can be applied to many types of display devices.

A display device according to the present disclosure includes: a display panel configured to display an image; a Poly-Vinyl Acetate (PVA) layer configured to linearly polarize external light; and a Quarter Wave Plate (QWP) configured to circularly polarize light. The QWP can have an in-plane retardation value of below 140 nm.

Reference will now be made in detail to an embodiment of the present disclosure, an example of which is illustrated in the accompanying drawings. This embodiment introduced hereinafter is provided as an example in order to convey their spirits to the ordinary skilled person in the art. Therefore, this embodiment might be embodied in a different shape, so is not limited to this embodiment described here.

Figure (FIG. 1 is a cross-sectional view showing an organic light-emitting display device according to an embodiment of the present disclosure. FIG. 2 is a cross-sectional view showing the configuration of a polarizing sheet in FIG. 1. FIG. 3 is a data sheet comparing an ordinary QWP and a QWP of the present embodiment in reflective visibility and reflectance.

As shown in FIGS. 1 through 3, an OLED device includes an OLED panel 100 configured to display an image, and a polarizing film 110 disposed on the OLED panel 100.

Although not shown in the drawings, the OLED panel 100 includes a plurality of cells arranged in a matrix structure where each cell is configured to emit light in accordance with an external signal. The amount of light emitted from the cells within the matrix structure can be adjusted according to colors to be displayed. In other words, the OLED panel 100 is a self-luminous device.

In such an OLED device, each cell is configured with a self-luminous element and a cell driver configured to control the amount of light emitted from the self-luminous element.

The OLED panel 100 can further include a color filter layer disposed on the self-luminous elements. The color filter layer is used to display a variety of colors.

Also, the OLED panel 100 can include a Touch Screen Panel (TSP) disposed on the plural cells each having the self-luminous element.

The OLED panel 100 can reflect external light being entered through the polarizing film 110.

In detail, the OLED panel 100 includes a plurality of metallic signal lines which are used to form the cell matrix structure. The metallic signal lines reflect light entering the OLED panel 100. Moreover, the OLED panel 100 further includes the other metallic materials. Similarly to the metallic signal lines, the other metallic materials can also reflect light entering the OLED panel 100.

The polarizing film 110 is used to enhance visibility of the OLED device. To this end, the polarizing film 110 prevents light entering from exterior and reflected by the OLED panel 100 from progressing to the exterior by converting the reflected light from the OLED panel 100 into circularly polarized light and re-converting the circularly polarized light into linearly polarized light.

The polarizing film 110 includes a first Tri-Acetyl Cellulose (TAC) layer 116, a Poly-Vinyl Acetate (PVA) layer 115 disposed on the lower surface of the first TAC layer 116, a second TAC layer 114 disposed on the lower surface of the PVA layer 115, a first adhesive layer 113 formed on the lower surface of the second TAC layer 114, a Quarter Wave Plate (QWP) 112 disposed on the first adhesive layer 113, and a second adhesive layer 111 formed on the lower surface of the QWP 112. The PVA layer 115 is used to linearly polarize light. The QWP 112 is used to circularly polarize light.

The PVA layer 115 enables natural light oscillating in several directions to be converted into light oscillating in a single direction. The PVA layer 115, in which iodine and dye molecules are arranged parallel to each other along an extended direction, can be prepared by extending a PVA film and dipping the extended PVA film into a solution of iodine and a dichroic dye. However, the PVA layer 115 has a weak mechanical-strength in a light transmission axis and contracts according to heat and/or moisture. As a result, the polarization characteristic of the PVA layer 115 can deteriorate. To address this matter, the above-mentioned first and second TAC layers 116 and 114 are disposed on both sides of the PVA layer 115 in order to secure the desired mechanical strength and prevent the contraction.

Transparent support layers (i.e., the first and second TAC layers 116 and 114) which are disposed on the upper and lower surfaces of the PVA layer 115 can be formed through one of top-down, bottom-up and lateral laminating processes.

The first adhesive layer 113 is formed on the lower surface of the second TAC layer 114. The QWP 112 from a poly-based resin can be disposed on the lower surface of the first adhesive layer 113.

The QWP 112 can be formed through one of top-down, bottom-up and lateral laminating processes. In order to secure a desired retardation value, the refractive index and thickness of the QWP 112 can be adjusted. Such a QWP 112 can generate a retardation of λ/4 for linearly polarized light from the PVA layer 115 and convert the linearly polarized light into circularly polarized light.

The second adhesive layer 111 is formed on the lower surface of the QWP 112. Also, the second adhesive is attached to the upper surface of the OLED panel 100.

The QWP 112 of the present embodiment can be defined as a retardation film.

Among in-plane refractive indices, a refractive index in an X-axis direction can be defined as "$n_x$", another refractive index in a y-axis direction can be defined as "$n_y$", and still another refractive index can be defined as "$n_z$". The characteristics of the retardation film can depend upon the above refractive indices. If the refractive indices in the three axes directions are different from one another, the retardation film can be a biaxial retardation film. The biaxial retardation film can be defined as follows.

When $n_x \neq n_y > n_z$, the retardation film becomes a negative biaxial retardation film. In this case, an in-plane retardation value $R_{in}$ obtained from the following equation 1 is larger than 0 (Rin>0).

$$R_{in} = d \times (n_x - n_y) \qquad \text{Equation 1}$$

where "d" refers to the thickness of the biaxial retardation film.

Meanwhile, a thickness retardation value $R_{th}$ obtained from the following equation 2 is smaller than 0.

$$R_{th} = d \times (n_z - n_y) \qquad \text{Equation 2}$$

where "d" refers to the thickness of the biaxial retardation film.

If $n_x \neq n_z > n_y$, the retardation film becomes a positive biaxial retardation film. In the positive retardation film, an in-plane retardation value $R_{in}$ obtained from the above-mentioned equation 1 is smaller than 0, but a thickness retardation value $R_{th}$ is larger than 0.

$$Nz=(n_x-n_z)/(n_x-n_y)$$ Equation 3

The QWP 112 can be formed to have an in-plane retardation value of below 140 nm. Preferably, the QWP 112 is formed to be in an in-plane retardation value range of 90~140 nm. In other words, the QWP 112 is designed to have in the in-plane retardation value range of 90~140 nm on the basis of a green light wavelength of 550 nm.

Moreover, a ratio Nz of the refractive indices in the x and y axes directions can be obtained from the above-mentioned equation 3. The QWP 112 can be designed to have a ratio Nz of the refractive indices in the x and y axes directions corresponding to 1.1. In this way, the QWP 112 is designed to be the in-plane retardation value of below 140 nm, thereby enhancing reflective visibility and reflectance.

FIG. 3 is a diagram comparing an ordinary QWP with an in-plane retardation value of 141 nm and a QWP of the present embodiment with an in-plane retardation value of 117 nm in reflective visibility and reflectance. As seen from FIG. 3, the QWP 112 of the present embodiment greatly enhances the reflective visibility and the reflectance compared to the ordinary QWP.

Figure 4B:
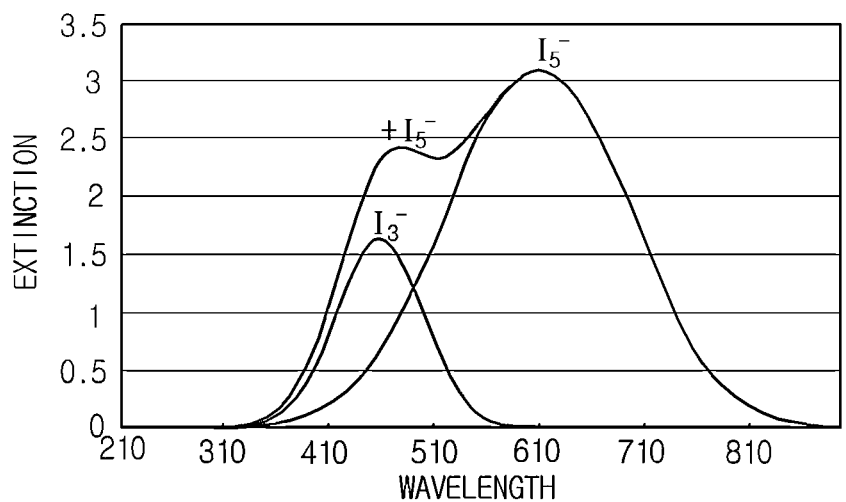
Figure 5:
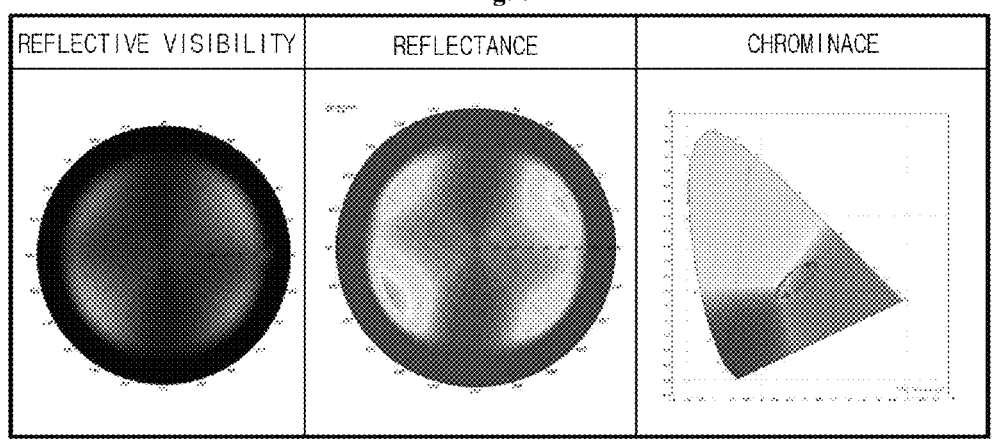
FIG. 5 is a diagram illustrating reflective visibility, reflectance and chrominance which are provided by QWP and PVA layer in accordance with an embodiment of the present disclosure.

FIGS. 4A and 4B are diagrams illustrating the extinction spectrum of a PVA layer according to an embodiment of the present disclosure with respect to an iodine molecular weight. FIG. 5 is a data sheet illustrating reflective visibility, reflectance and chrominance which are provided by QWP and PVA layer in accordance with an embodiment of the present disclosure.

The data shown in FIGS. 4 and 5 are obtained from a simulation when the QWP 112 of the present embodiment has an in-plane retardation value of below 140 nm.

When the QWP 112 of the present embodiment is designed to be an in-plane retardation value of below 140 nm, reflective visibility and reflectance can be enhanced, but chrominance can vary.

For example, the QWP 112 is designed to be no more than an in-plane retardation value of 90 nm. In this case, a color shift causing a red color to be visibly recognized can be generated.

In order to prevent the generation of a color shift due to the QWP 112, the PVA layer 115 can be formed in such a manner as to increase an iodine molecular weight.

The polarizing performance of the PVA layer 115 depends upon the iodine and dye molecules which are arranged parallel to each other along the extended direction of the PVA layer 115. Particularly, the extinction spectrum of the PVA layer 115 depends upon the iodine molecular weight.

As such, the iodine molecular weight within the PVA layer 115 of the present embodiment can be adjusted along the in-plane retardation value of the QWP 112, so that the iodine molecules absorb a short wavelength band of light. In accordance therewith, the generation of a color shift can be prevented. In view of this point, the PVA layer 115 of the present embodiment can have an iodine molecular weight larger than that of the ordinary PVA layer.

Also, the iodine molecular weight within the PVA layer 115 can be adjusted in proportion to the in-plane retardation value of the QWP 112.

The polarizing film of the present embodiment can be optimized. To this end, the QWP 112 is designed to have an in-plane retardation value of about 130 nm, and a ratio Nx of the refractive indices in the x and y axes directions corresponds to 1.1. Also, the PVA layer 115 is designed to have an iodine molecular weight corresponding to the in-plane retardation value of the QWP 112.

In this manner, the polarizing film of the present embodiment includes the QWP 112 designed to be the in-plane retardation value of below 140 nm and the PVA layer 115 designed to have an iodine molecular weight in proportion to the in-plane retardation value of the QWP 112. As such, the reflective visibility and the reflectance of the OLED device can be enhanced. Simultaneously, the generation of a color shift can be prevented. Therefore, the image quality of the OLED device can be enhanced.

Although the polarizing film applied to the OLED device has been explained as an embodiment of the present disclosure, but it is not limited to this. In other words, the polarizing film can be applied to an LCD device and so on.

Moreover, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A display device comprising:
an organic light-emitting diode (OLED) display panel configured to display an image;
a first tri-acetyl cellulose (TAC) layer;
a second tri-acetyl cellulose (TAC) layer;
a Poly-Vinyl Acetate (PVA) layer between the first TAC layer and the second TAC layer, the PVA layer configured to linearly polarize external light; and
a Quarter Wave Plate (QWP) configured to circularly polarize light, the QWP placed closer to the display panel than the PVA layer,
wherein the QWP has an in-plane retardation value in a range of 90 through 140 nm, and a ratio of reflective indices in x and y axes directions corresponding to 1.1,
wherein the PVA layer has an iodine molecular weight in accordance with the in-plane retardation value of the QWP.

2. The display device of claim 1, further comprising:
a first adhesive layer between the second TAC layer and the QWP; and
a second adhesive layer between the QWP and the display panel.

* * * * *